(12) United States Patent
Nagai et al.

(10) Patent No.: US 7,683,393 B2
(45) Date of Patent: Mar. 23, 2010

(54) WIRING SUBSTRATE FOR MOUNTING LIGHT EMITTING ELEMENT

(75) Inventors: Makoto Nagai, Komaki (JP); Setsuo Yada, Konan (JP); Atsushi Uchida, Kagamigahara (JP)

(73) Assignee: NGK Spark Plug Co., Ltd., Aichi (JP)

( * ) Notice: Subject to any disclaimer, the term of this patent is extended or adjusted under 35 U.S.C. 154(b) by 87 days.

(21) Appl. No.: 11/294,539

(22) Filed: Dec. 6, 2005

(65) Prior Publication Data

US 2006/0118804 A1 Jun. 8, 2006

(30) Foreign Application Priority Data

Dec. 7, 2004 (JP) .................... P. 2004-353574

(51) Int. Cl.
*H01L 27/15* (2006.01)
*H01L 33/00* (2006.01)

(52) U.S. Cl. ............ 257/98; 257/99; 257/E33.056; 257/E33.058; 257/E33.066; 257/E33.072

(58) Field of Classification Search .............. 257/98, 257/99, 622, 669, 698, 712, 717, E33.056, 257/E33.058, E33.066, E33.072
See application file for complete search history.

(56) References Cited

U.S. PATENT DOCUMENTS

| | | | | |
|---|---|---|---|---|
| 5,763,059 | A * | 6/1998 | Yamaguchi et al. | 428/209 |
| 5,814,883 | A * | 9/1998 | Sawai et al. | 257/712 |
| 6,531,328 | B1 * | 3/2003 | Chen | 438/26 |
| 6,707,150 | B1 * | 3/2004 | Lee | 257/730 |
| 6,818,464 | B2 * | 11/2004 | Heschel | 438/22 |
| 2003/0189830 | A1 * | 10/2003 | Sugimoto et al. | 362/294 |
| 2004/0089472 | A1 | 5/2004 | Ninomiya et al. | |
| 2005/0030762 | A1 * | 2/2005 | Kato et al. | 362/555 |
| 2006/0147746 | A1 * | 7/2006 | Wakako et al. | 428/627 |
| 2007/0007540 | A1 * | 1/2007 | Hashimoto et al. | 257/94 |
| 2008/0023713 | A1 * | 1/2008 | Maeda et al. | 257/98 |

FOREIGN PATENT DOCUMENTS

| | | | |
|---|---|---|---|
| JP | 59099746 | A * | 6/1984 |
| JP | 2002-232017 | | 8/2002 |
| JP | 2004-111937 | A | 4/2004 |
| JP | 2004207258 | A * | 7/2004 |
| JP | 2004/259893 | A | 9/2004 |
| JP | 2004-311467 | A | 11/2004 |
| JP | 2004-319939 | A | 11/2004 |
| WO | 2004/049462 | A1 | 6/2004 |

OTHER PUBLICATIONS

English translation of JP2004-111937A of record.*
English translation of JP2004-319939A of record.*
Extended European Search Report dated Dec. 3, 2008.
Office Action dated Sep. 1, 2009 in counterpart Japanese Application.

* cited by examiner

*Primary Examiner*—Davienne Monbleau
*Assistant Examiner*—Christopher M Roland
(74) *Attorney, Agent, or Firm*—Sughrue Mion, PLLC (57) ABSTRACT

A wiring substrate for mounting a light emitting element, comprising: a substrate body comprising an insulating material and having a first surface and a back surface; and a cavity being opened into the first surface of said substrate body and having a mounting area for mounting a light emitting element at a bottom face of said cavity, wherein a metalized layer provided along a side face of said cavity and metalized layers provided in said substrate body are provided to continue to each other.

8 Claims, 8 Drawing Sheets

WIRING SUBSTRATE FOR MOUNTING LIGHT EMITTING ELEMENT

FIELD OF THE INVENTION

The present invention relates to a wiring substrate for mounting a light emitting element such as a light emitting diode.

BACKGROUND OF THE INVENTION

In the wiring substrate for mounting the light emitting element, the light emanating from the light emitting element can be made clear by forming a light reflecting layer made from a metal on the side face of a cavity for mounting the light emitting element and by filling the cavity with a sealing resin to have a flat surface.

There is proposed (as referred to JP-A-2002-232017 (pages 1 to 7, FIG. 1), for example) a light emitting element mounting package, in which the light emitting element is mounted on the bottom face of a cavity having a sloped side face extending to the outer side by laminating a ceramic aperture frame having the sloped through hole and a flat ceramic substrate and in which a light reflecting metal layer is formed on the side face.

In the package of JP-A-2002-232017 (pages 1 to 7, FIG. 1), however, as the sealing resin fitted in the through hole shrinks, the light reflecting metal layer formed in advance on the sloped side face of the through hole of the ceramic aperture frame is subjected to a stress. This causes a problem that the metal layer peels off the ceramic aperture frame or is strained to lower the light reflecting efficiency.

SUMMARY OF THE INVENTION

The present invention contemplates to solve the aforementioned problems of the prior art and has an object to provide a wiring substrate for mounting light emitting element having a light reflecting metallized layer, which can efficiently reflect a light coming from a light emitting element mounted in a cavity and which has a high bonding strength.

In order to solve the aforementioned problems, the present invention has been conceived by forming a metallized layer continuously for constituting a light reflecting layer not only on the side face of a cavity but also in a substrate body.

According to the invention, there is provided a wiring substrate for mounting light emitting element comprising: a substrate body comprising an insulating material and having a first surface and a rear surface; and a cavity opened into the first surface of the substrate body and having a mounting area for a light emitting element in a bottom face, wherein a metallized layer formed on the side face of the cavity and metallized layers formed in the substrate body are formed to continue to each other.

According to this configuration, the metallized layer is continuously formed not only on the side face of the cavity but also in the substrate body. Even if the sealing resin before solidified fills the cavity and is solidified, its shrinking stress makes it difficult for the metallized layer formed beforehand on the side face of the cavity to deform or peel off the side face of the cavity. Therefore, the light emanating from the light emitting element mounted on the bottom face of the cavity can be efficiently reflected.

Here, the insulating material includes ceramics composed mainly of alumina, glass-ceramics or a kind of low-temperature sintered ceramics, or a synthetic resin of an epoxy group.

The cavity presents a circular, oval or elliptical shape in a top plan view, and its side face includes not only a vertical face along the thickness direction of the substrate body but also a sloped face becoming wider toward the first surface of the substrate body.

Moreover, the metallized layer contains W or Mo or the like and is formed on the side face and the bottom face of the cavity or on the first surface of the substrate body. The metallized layer can form a light reflecting layer by itself. Alternatively, the light reflecting layer may also be formed by coating the first-named light reflecting layer with a nickel-plated layer or a plated layer of Ag, Pt, Pd or Rh for a light reflecting face.

In one mode of the invention, the metallized layers are formed to continue from the upper end of the side face of the cavity to the first surface of the substrate body.

According to this mode, the metallized layers are formed continuously on the side face of the cavity and the first surface of the substrate body so that its surface can make the reflecting area wider. Even the metallized layers are subjected, when a sealing resin before solidified is filled in the cavity having the light emitting element mounted, to a stress accompanying the shrinkage of the sealing resin, the stress is not concentrated near the corners between the side face of the cavity and the first surface of the substrate body but is dispersed, because the metallized layers are formed continuously on the side face of the cavity and the first surface of the substrate body. As a result, it is possible to enhance excellently the bonding strength between the metallized layers and the insulating material of the substrate body.

In another mode of the invention, the metallized layers are formed to continue from the lower end of the side face of the cavity to the bottom face of the cavity.

According to this mode, the metallized layers are formed to continue on the side face and the bottom face of the cavity. Therefore, the reflecting area can be enlarged to reflect the light emanating from the light emitting element, which is mounted in the mounting area on the bottom face of the cavity, efficiently over a wide angle.

In still another mode of the invention, of the metallized layers, a horizontal portion formed on the bottom face of the cavity proceeds at its outer end portion into the substrate body.

According to this mode, when the substrate body is to be manufactured, the metallized layers can be reliably formed continuously on the side face and the bottom face of the cavity. Of the insulating members to form the substrate body, more specifically, the upper laminate having a through hole to become the side face of the cavity and the lower laminate not having the through hole had by the upper laminate are formed in advance. After this, the metallized layers are formed not only on the side face of the through hole in the upper laminate and on the bottom face to merge into that side face but also on the portion of the surface of the lower laminate to form the bottom face of the cavity. Next, these upper laminate and lower laminate are laminated so that the metallized layers continuing on the side face and the bottom face of the cavity can be reliably formed. Moreover, the outer end portion proceeds into the substrate body sufficiently so that the adhesion of the substrate body to the metallized layers can be adequately ensured even under the shrinking stress of the sealing resin.

Even if a lamination displacement occurs when the upper laminate having the through hole in its inside and the lower laminate having no through hole are laminated, it can be prevented that the surface of the insulating member is unintentionally exposed to the betweenness of the side face and the bottom face of the cavity. As a result, it is possible to suppress the drop of the light reflecting efficiency and to establish the conduction through that metallized layer.

In the wiring substrate for mounting light emitting element of the invention, moreover, of the metallized layers, the metallized layer formed on the side face of the cavity is coated with plated layers.

In the wiring substrate for mounting light emitting element of the invention, moreover, of the metallized layers, the metallized layers formed continuously on the side face of the cavity and the first surface of the substrate body are coated with plated layers.

In the wiring substrate for mounting light emitting element of the invention, moreover, of the metallized layers, the metallized layers formed continuously on the side face and the bottom face of the cavity are coated with plated layers.

In these cases, the metallized layers are formed continuously into the inside of the substrate body. As a result, the metallized layers can be finely coated with the plating layers so that the light emanating from the light emitting element can be efficiently reflected over a wide angle.

DESCRIPTION OF REFERENCE NUMERALS AND SIGNS 1, 1a - - - Wiring Substrate (Wiring Substrate For Mounting Light Emitting Element)
2, 2a - - - Substrate Body
3 - - - First surface
4 - - - Back surface
5, 5a - - - Cavity
6 - - - Bottom Face
7, 7a - - - Side Face
9 - - - Light Emitting Element
10, 30 - - - Light Reflecting Layer
11, 31 - - - Side Face Portion
12, 32 - - - Bottom Face Portion
19 (19u to 19z) - - - Metallized Layer
19x - - - Horizontal Portion of Metallized Layer
19w - - - Outer End Portion of Horizontal Portion
a - - - Mounting Area
s1 to s10 - - - Ceramic Layers (Insulating Members)

DETAILED DESCRIPTION OF THE INVENTION

The best mode for carrying out the invention will be described in the following.

Figure 1:
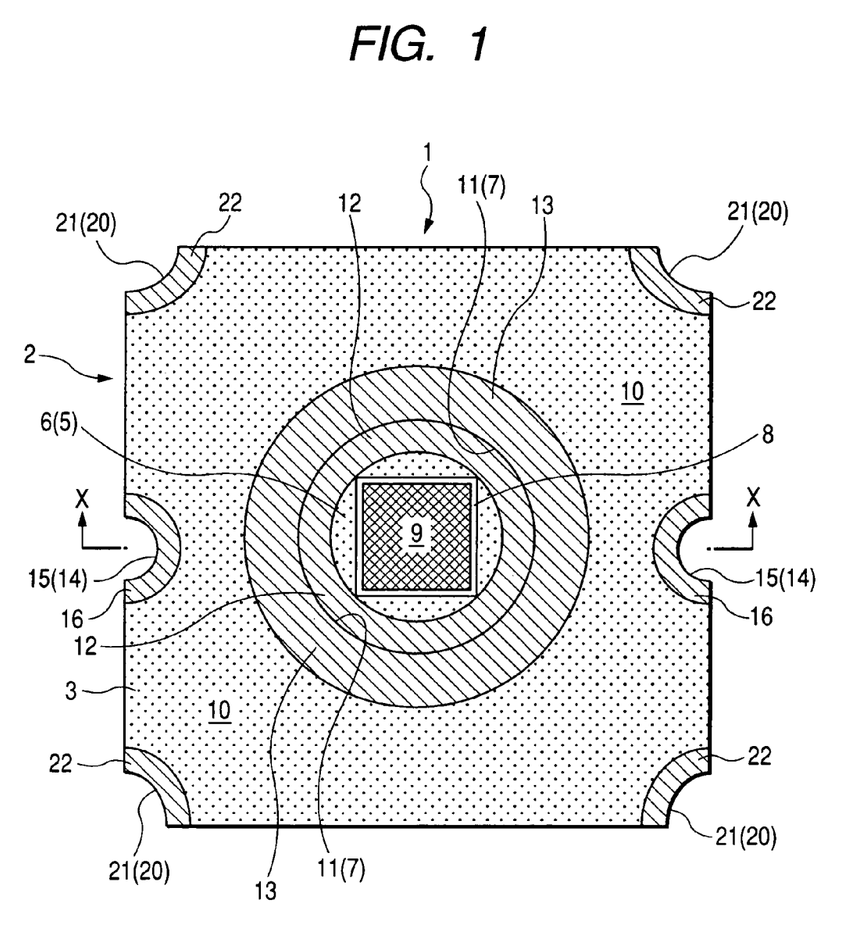
FIG. 1 is a top plan view showing a wiring substrate for mounting light emitting element according to one mode of the invention.
Figure 2:
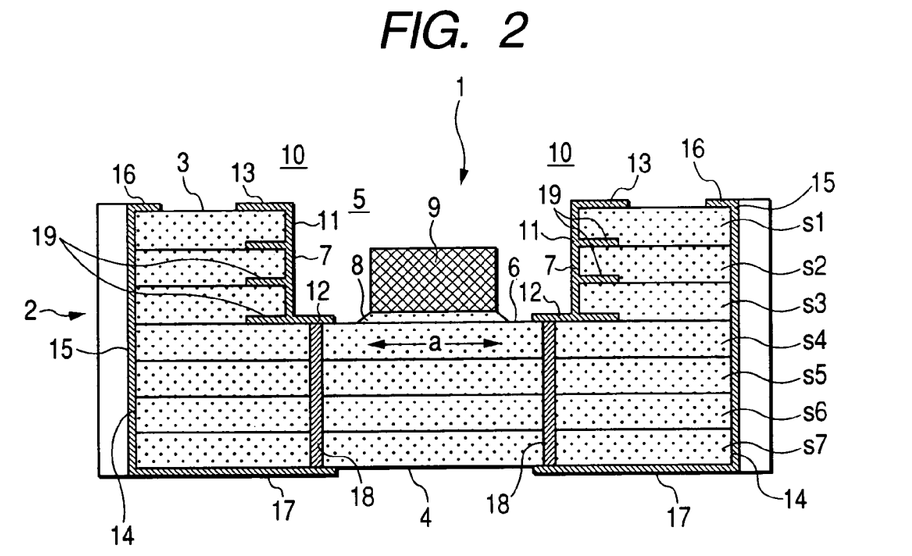
FIG. 2 is a vertical section taken along line X-X of FIG. 1.

FIG. 1 is a top plan view showing a wiring substrate 1 for mounting light emitting element according to one mode of the invention, and FIG. 2 is a vertical section taken along line X-X of FIG. 1. In the following description, the wiring substrate for mounting light emitting element is called merely as the "wiring substrate".

The wiring substrate 1 was configured, as shown in FIG. 1 and FIG. 2, to include: a substrate body 2 presenting a substantially square shape in a top plan view and having a first surface 3 and a back surface 4; a cavity 5 opened in the first surface 3 of the substrate body 2; and a light reflecting layer 10 formed continuously on the side face 7 and a bottom face 6 of the cavity 5 and the first surface 3 of the substrate body 2.

The substrate body 2 was integrally laminated of ceramic (or insulating) layers s1 to s7 composed mainly of alumina, for example. In the substrate body 2, the not-shown wiring layers and internal electrodes were formed in desired patterns, between which via conductors 18 were interposed therethrough. Incidentally, the substrate body 2 had sizes of about 5 mm×5 mm×0.9 mm.

The cavity 5 presented a circular shape in a top plan view and was provided at the center of its bottom face 6 with a mounting area a, in which a light emitting element 9 such as a light emitting diode having a square in a top plan view was mounted through a soldering material 8 or an epoxy resin. Here, the cavity 5 had sizes of an internal diameter of about 3.6 mm and a depth of about 0.45 mm, and the soldering material 8 was made from an alloy of an Au—Sn group having a low melting point, for example.

Figure 3:
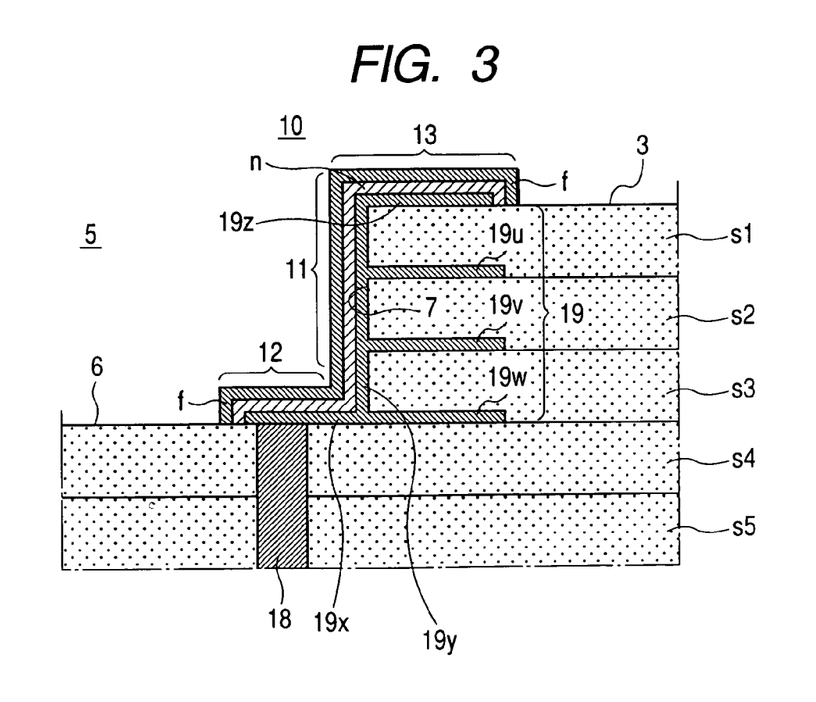
FIG. 3 is a schematic section showing the vicinity of a metal layer in FIG. 2 in an enlarged scale.

As schematically shown in enlarged scales in FIGS. 1 and 2 and FIG. 3, moreover, on the bottom face 6 and the side face 7 of the cavity 5, on the first surface 3 of the substrate body 2, at the betweenness of the ceramic layers s1 and s2, at the betweenness of the ceramic layers s2 and s3 and at the betweenness of the ceramic layers s3 and s4, there were formed metallized layers 19 (19u to 19z), which were made from W or Mo to have a thickness of about 10 to 30 μm and a substantially combed shape in the entire section.

Of these, the surface of the metallized layer 19y formed on the first surface 3 of the substrate body 2 and the bottom face 6 and the side face 7 of the cavity 5 were coated with a nickel-plated layer n. On the other hand, the horizontal portion 19x formed on the bottom face 6 of the cavity 5 in the metallized layers 19 had its outer end portion 19w protruded into the inside (i.e., between the ceramic layers s3 and s4) of the substrate body 2.

The light reflecting layer 10 was configured to include; the metallized layers 19; the nickel-plated layer n; and a plated layer f formed of Ag, Pt, Rh or Pd on the surface of the nickel-plated layer n to have a thickness of about 5 μm. As shown in FIG. 2 and FIG. 3, the light reflecting layer 10 was integrally composed of: a side face portion 11 formed on the side face 7 of the cavity 5; a bottom face portion 12 formed to continue to the lower end of the side face portion 11 formed on the bottom face 6 of the cavity 5; and a surface portion 13 formed to continue to the upper end of the side face portion 11 and to form on the first surface 3 of the substrate body 2. By the side face portion 11 and the bottom face portion 12 of the light reflecting layer 10, the light emanating from the light emitting element 9 could be clearly reflected to irradiate the outside of the wiring substrate.

Figure 4:
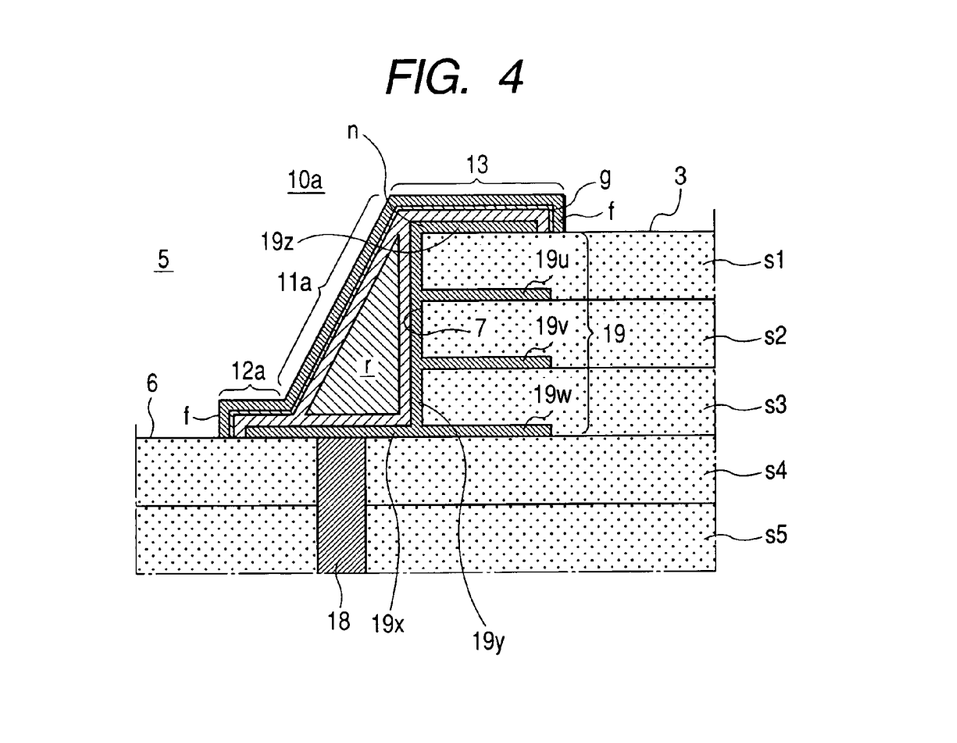
FIG. 4 is a schematic section showing a modification of the metallized layer.

FIG. 4 is a section schematically showing a light reflecting layer 10a according to a modification of the light reflecting layer 10 thus far described. As shown in FIG. 4, the metallized layers 19 (19u to 19z) substantially the same as the aforementioned ones were formed on the side face 7 and the bottom face 6 of the cavity 5, on the first surface 3 of the substrate body 2, at the betweenness of the ceramic layers s1 and s2, at the betweenness of the ceramic layers s2 and s3 and at the betweenness of the ceramic layers s3 and s4. Of these, the metallized layers 19y, 19x and 19z formed on the side face 7 and the bottom face 6 of the cavity 6 and the first surface 3 of the substrate body 2 were plated along their surfaces with the double inner and outer nickel-plated layers n. The light reflecting layer 10a was formed by coating the surface of an Au-plated layer g, which coated the surface of the outer nickel-plated layer n to a thickness of about 0.10 μm, with the Ag-plated layer f.

Here, the inner portion defined between the nickel-plated layers n and n and confined by the side face 7 and the bottom face 6 of the cavity 5 was filled with the soldering material r of a substantially triangular section, which was made from 72 to 85 wt. % of Ag—Cu group alloy.

The light reflecting layer 10a was composed of the metallized layers 19, the nickel-plated layer n and the Ag-plated layer f having a thickness of about 5 μm. As shown in FIG. 4, the light reflecting layer 10a was configured to include a bottom face portion 12a, a sectional side face portion 11a having a substantially conical shape in its entirety and a sloped section, and the surface portion 13 similar to the aforementioned one. The light reflecting layer 10a was formed continuously on the bottom face 6 of the cavity 5, the sloped face made by the soldering material r, and the first surface 3 of the substrate body 2.

At the centers of the right and left side faces of the substrate body 2, as shown in FIG. 1 and FIG. 2, there were symmetrically formed recesses 14 which have a substantially semicircular shape in a top plan view. Entirely of the surfaces of those recesses 14, there were formed recessed conductors 15 having a semicircular section. These recessed conductors 15 were connected at their upper ends with substantially semicircular surface electrodes 16 which were formed on the first surface 3 of the substrate body 2. Moreover, the recessed conductors 16 were connected at their lower ends with a slender back electrode 17 which was formed on the back surface 4 of the substrate body 2. This back electrode 17 was connected, as shown in FIG. 2, with the lower ends of the via conductors 18.

At the four corners of the substrate body 2, as shown in FIG. 1 and FIG. 2, there were formed recesses 20 having an arcuate shape in a top plan view. Entirely of the surfaces of those recesses 20, there were formed recessed conductors 21 having an arcuate section. These recessed conductors 21 were connected at their upper ends with arcuate surface electrodes 22, which were formed at their four corners of the first surface 3 of the substrate body 2, and at their lower ends with the not-shown back electrode, which was formed on the back surface 4 of the substrate body 2.

Here, the recessed conductors 15 and 21, the surface electrodes 16 and 22 and the back electrode 17 were made from W or Mo to have a thickness of about 10 to 30 μm.

The light emitting element 9 was mounted through the soldering material 8 in the mounting area a which was positioned on the bottom face 6 of the cavity 5 of the wiring substrate 1. After this, the cavity 5 was filled with the not-shown sealing resin before solidified, and this resin was then solidified to have its surface flush with the first surface 3 of the substrate body 2. By the side face portion 11 and the bottom face portion 12 of the light reflecting layer 10, the light emanating from the light emitting element 9 could be efficiently reflected to irradiate the outside through the sealing resin.

The side face portion 11 and the bottom face portion 12 of the light reflecting layer 10 including the metallized layers 19 were continuously formed so that the surface was the continuous light reflecting layer 10. Therefore, the ceramic layers s3 and s4 did not have their surfaces exposed between the side face portion 11 and the bottom face portion 12, even if displaced in their lamination, to the outside so that the light reflecting efficiency was not lowered while keeping the conduction through the side face portion 11 and the bottom face portion 12.

Moreover, the shrinking stress accompanying the solidification of the sealing resin was concentrated near the corners between the side face portion 11 of the light reflecting layer 10 and the surface portion 13 on the first surface 3 of the substrate body 2, the shrinking stress could be dispersed to the bottom face portion 12 and the surface portion 13 continuing to the side face portion 11 thereby to enhance the bonding strength of the light reflecting layer 10 including the metallized layers 19 to the substrate body 2.

For the shrinking strength, moreover, the metallized layers 19u to 19w formed in the substrate body 2 continued to the metallized layer 19y of the side face portion 11 so that the bonding strength of the light reflecting layer 10 including the metallized layers 19 to the substrate body 2 to the substrate body 2 could be enhanced.

The wiring substrate 1 sealing the inside of the cavity 5 with the sealing resin is mounted on the surface of a printed substrate such as a mother board through the not-shown surface electrode positioned on the surface of the printed substrate and through the soldering material formed across the recessed conductors 15 and 21, their back electrode 17 and so on.

The wiring substrate 1 thus far described was manufactured: by laminating/pressing a plurality of green sheets, which were made mainly of alumina on the surface with a predetermined pattern of conductive paste containing metallic powder of W or Mo; by sintering the laminate obtained by printing the side face 7 of the cavity 5 formed with the conductive paste, at a temperature within a desired range; and by plating the laminate with Ni, Au or Ag by contacting plating electrodes with the recessed conductors 15 and 21.

Alternatively, the wiring substrate 1 could also be manufactured by the following multiple method.

Figure 5:
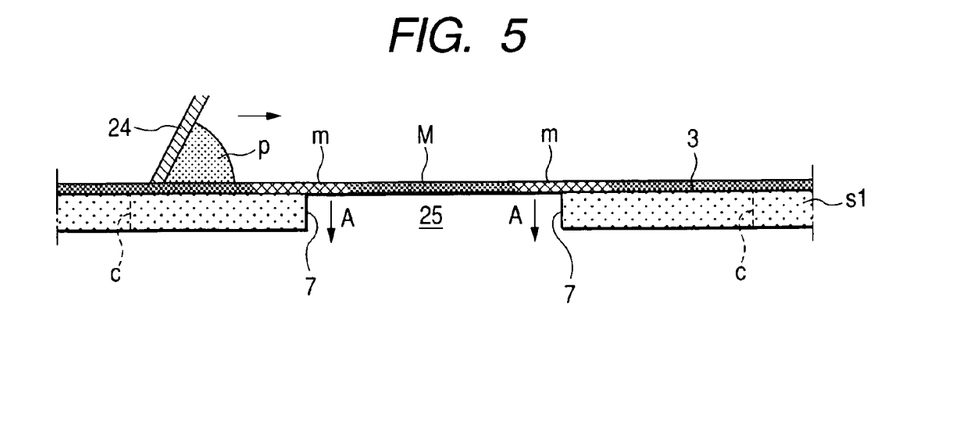
FIG. 5 is a schematic diagram showing one manufacturing process for obtaining the wiring substrate.

First of all, as shown in FIG. 5, there was prepared the large-sized green sheet s1 having the upper end portions of that of product portions, longitudinally and transversely, which would become, when cut, the substrate body 2 having a through hole 25 to become a portion of the cavity 5.

At the individual intersections of cutting lines c, as indicated by broken lines in FIG. 5, column-shaped through holes 26 were later formed by a press-cutting operation.

As shown in FIG. 5, a screen mask M was mounted on the side of the first surface 3 of the green sheet s1, and net portions m having a ring shape in a top plan view on the screen mask M and a desired width size were arranged just above the side face 7 of the through hole 25 of each product portion. As indicated by a vertical arrow in FIG. 5, air A was sucked downward in the vicinity of the ring-shaped net portions m. Of the screen mask M, the portions other than the net portions m were clogged by applying an emulsion.

In this state, a conductive paste p containing metallic powder of W or Mo was slid, as indicated by a horizontal solid arrow in FIG. 5, along the upper face of the screen mask M while being pressed by squeegee 24 in an oblique position.

Figure 6:
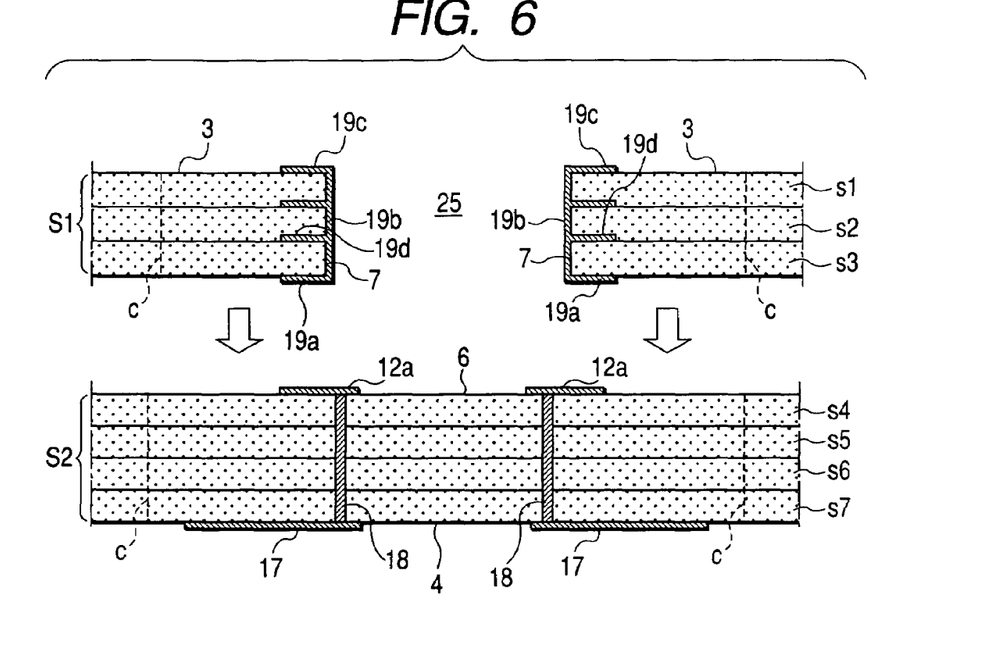
FIG. 6 is a schematic diagram showing a manufacturing step subsequent to FIG. 5.

As a result, the conductive paste p passed the ring-shaped net portions m so that a metallized layer 19b was printed along the side face 7 of the through hole 26 and so that a metallized layer 19c continuing to the upper end of the metallized layer 19b was printed along the first surface 3 of the substrate body 2, as shown in FIG. 6. Moreover, the green sheet s1 was inverted upside down, and the conductive paste P was likewise printed to form a metallized layer 19d on the bottom face of the green sheet s1.

These steps were applied to the green sheets s2 and s3 so that metallized layers 19a to 19d were formed substantially in a C-shape. After this, the green sheets s1 to s3 were laminated to form a large-sized laminate S1, as shown in the upper portion of FIG. 6. At this time, the metallized layers 19a to 19d having the C-shaped section for the individual green sheets s1 to s3 were formed into the metallized layers 19 having a substantially comb-shaped section in their entirety.

Next, as shown in the lower portion of FIG. 6, the plural green sheets s4 to s7 to form the substantially lower halves of the individual product portions were laminated to form a large-sized laminate S2, and the conductive paste p of a ring shape was printed on the surface of the laminate S2 by means of the metal mask M and the squeegee 24 thereby to form the metallized layer 12a. Here, the via conductors 18 had been formed in the respective product portions of the laminate S2 before the metallized layers were formed. As shown in FIG. 6, moreover, the back electrode 17 was formed like before on the back surfaces 4 of the individual product portions of the laminate S2.

Next, the laminate S1 was laminated and pressed on the laminate S2, as indicated by blank arrows in FIG. 6. At this time, even if the laminates S1 and S2 have a displacement in their lamination, both their metallized layers 19a and 12a are electrically connected without fail, and the ceramic layers s3 and s4 were not exposed to the surface.

Figure 7:
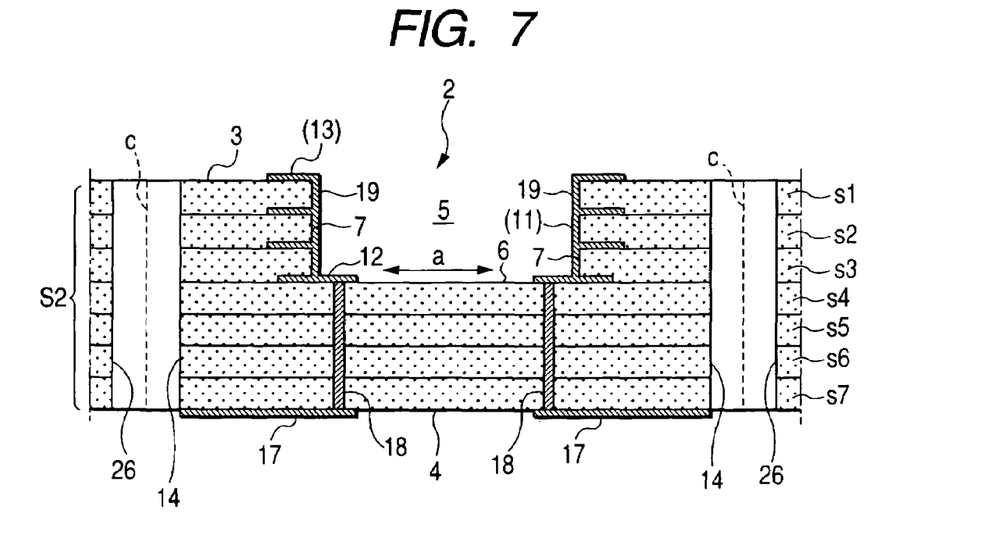
FIG. 7 is a schematic diagram showing a manufacturing step subsequent to FIG. 6.

As a result, there was obtained a large-sized laminate S3, in which the green sheets s1 to s7 were laminated and in which the individual product portions had the cavity 5 opened to the first surface 3, as shown in FIG. 7. At the lower corners of the cavity 5 of the individual product portions, the metallized layer 19a of the laminate S1 and the metallized layer 12a of the laminate S2 were connected to form the metallized layers 19 (19u to 19z) having a substantially comb-shaped section in their entirety, as shown in FIG. 7.

Moreover, the through holes 26 were formed at the intersections of the cutting lines c, and the (not-shown) metallized layers to become the recessed conductors 15 and 21 were printed on the inner circumference 26 of the through hole 26 and on the first surface 3 and the back surface 4 of the laminate S3 adjacent to the upper and lower ends of the through hole 26.

That laminate S3 was sintered at a temperature within a desired range and was then cut along the cutting lines c, as shown in FIG. 7, to form the plural substrate bodies 2 having the recesses 4 and the recessed conductors 15 on the right and left opposed side faces and having the recesses 20 and the recessed conductors 21 at the four corners.

Then, the plating electrodes were brought into contact with the recessed conductors 15 to plate the surface of the metallized layer 19 with the nickel-plated layer n through the back electrode 17 and the via conductors 18, and the nickel-plated layer n was plated on its surface with the Ag-plated layer f thereby to form the light reflecting layer 10 having a flat surface. Thus, the substrate body 2 was manufactured.

In case the light reflecting layer 10a was formed, the nickel-plated layer n was formed by the two separate operations, between which the soldering material 8 was filled. Alternatively, the green sheets s1 to s3 may be laminated beforehand to form the large-sized laminate S1, and the conductive paste p may be printed, as shown in FIG. 5, on the side face 7, the first surface 3 and the bottom face of that laminate S1 thereby to form the metallized layers 19a to 19c having a substantially C-shaped section.

Figure 8:
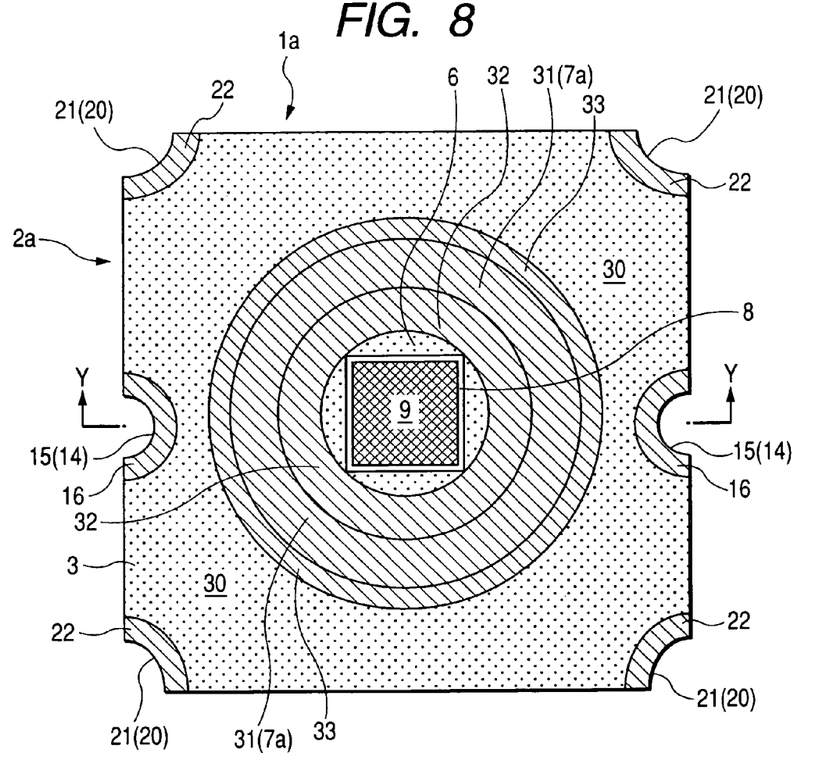
FIG. 8 is a top plan view showing a wiring substrate for mounting light emitting element according to a different mode.
Figure 9:
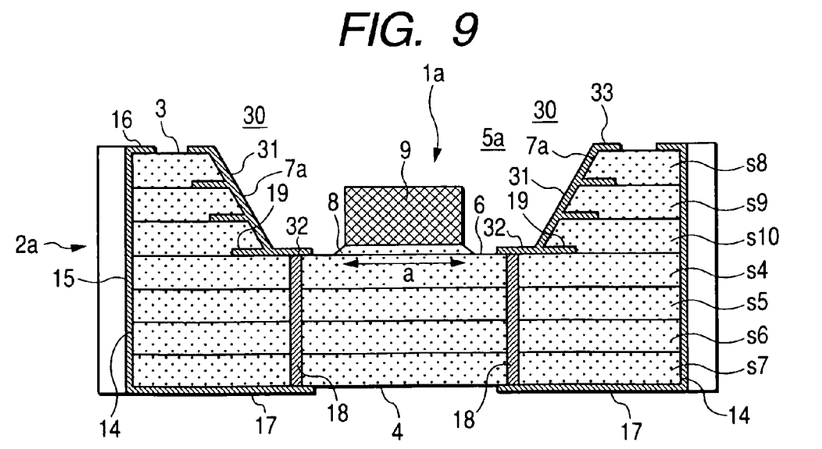
FIG. 9 is a vertical section taken along line Y-Y of FIG. 8.

FIG. 8 is a top plan view showing a wiring substrate 1a in a different mode, and FIG. 9 is a vertical section taken along line Y-Y of FIG. 8.

The wiring substrate 1a was configured, as shown in FIG. 8 and FIG. 9, to include: a substrate body 2a presenting a substantially square shape in a top plan view and having a first surface 3 and a back surface 4, a cavity 5a opened in the first surface 3 of the substrate body 2a; and a light reflecting layer 30 formed continuously on the first surface 3 of the substrate body 2a and the side face 7a and the bottom face 6 of the cavity 5a.

The substrate body 2a was integrally laminated of ceramic (or insulating) layers s4 to s10 composed mainly of alumina, for example. In the substrate body 2a, the not-shown wiring layers and internal electrodes were formed in desired patterns, between which via conductors 18 were interposed therethrough.

The cavity 5a presents such a substantially conical shape in its entirety as had a circular top plan view and the sloped side face 7a along its entire circumference. In the mounting area a at the center of the bottom face 6 of the cavity 5a, there was mounted a light emitting element 9 like before through the soldering material 8 or an epoxy resin.

As shown in FIGS. 8 and 9, moreover, on the bottom face 6 and the side face 7a of the cavity 5a, and on the first surface 3 of the substrate body 2a, there were formed metallized layers 19 (19u to 19z) like before, which were made from W or Mo to have a thickness of about 10 to 30 µm and a substantially combed shape in the entire section, and which were coated on their surfaces with the (not-shown) nickel-plated layer. Specifically, the horizontal portion (19x) formed on the bottom face 6 of the cavity 5a in the metallized layers 19 had its outer end portion (19w) protruded into the inside (i.e., between the ceramic layers s4 and s10) of the substrate body 2a.

The light reflecting layer 30 was configured to include: the metallized layers 19; the nickel-plated layer; and a plated layer formed of Ag on the surface of the nickel-plated layer to have a thickness of about 5 µm. The light reflecting layer 30 was integrally composed of: a side face portion 31 formed on the side face 7a of the cavity 5a; a bottom face portion 32 formed to continue to the lower end of the side face portion 31 and to form on the bottom face 6 of the cavity 5a; and a surface portion 33 formed to continue to the upper end of the side face portion 31 and to form on the first surface 3 of the substrate body 2a. By the side face portion 31 and the bottom face portion 32 of the light reflecting layer 30, the light emanating from the light emitting element 9 could be efficiently reflected to irradiate the outside of the wiring substrate and to effect conduction therethrough.

At the centers of the right and left side faces of the substrate body 2a, as shown in FIG. 8 and FIG. 9, there were formed the recesses 14 and the recessed conductors 15 like before. These recessed conductors 15 were connected at their upper ends with the surface electrodes 16 which were formed on the first surface 3 of the substrate body 2*a*. Moreover, the recessed conductors 16 were connected at their lower ends with slender back electrode 17 which was formed on the back surface 4 of the substrate body 2*a*. This back electrode 17 was connected, as shown in FIG. 9, with the via conductors 18.

At the four corners of the substrate body 2*a*, as shown in FIG. 8 and FIG. 9, there were formed the recesses 20 and the recessed conductors 21 like before. These recessed conductors 21 were connected at their upper ends with arcuate surface electrodes 22, which were formed at their four corners of the first surface 3 of the substrate body 2*a*, and at their lower ends with the not-shown back electrode, which was formed on the back surface 4 of the substrate body 2*a*.

The light emitting element 9 was mounted through the soldering material 8 in the mounting area a which was positioned on the bottom face 6 of the cavity 5*a* of the wiring substrate 1*a*. After this, the cavity 5*a* around the light emitting element 9 was filled with the not-shown sealing resin before solidified, and this resin was then solidified to have its surface flush with the first surface 3 of the substrate body 2*a*.

By the side face portion 31 and the bottom face portion 32 of the light reflecting layer 30, the light emanating from the light emitting element 9 could be efficiently reflected to irradiate the outside through the sealing resin.

The side face portion 31 and the bottom face portion 32 of the light reflecting layer 30 including the metallized layers 19 were continuously formed. Therefore, the ceramic layers s4 and s10 were not exposed to the surfaces, even if displaced in their lamination, to the outside, and their surfaces were the continuous light reflecting layer 30. As a result, the light reflecting efficiency was not lowered while keeping the conduction therethrough.

Moreover, the shrinking stress accompanying the solidification of the sealing resin was concentrated near the corners between the side face portion 31 of the light reflecting layer 30 and the surface portion 33, the shrinking stress could be dispersed to the bottom face portion 32 and the surface portion 33 continuing to the side face portion 31 thereby to enhance the bonding strength of the light reflecting layer 30 including the metallized layers 19 to the substrate body 2*a*. For the shrinking strength, moreover, the metallized layers 19 (19*u* to 19*w*) formed in the substrate body 2*a* continued to the metallized layer 19*y* of the side face portion 31 so that the bonding strength of the light reflecting layer 30 including the metallized layers 19 to the substrate body 2*a* to the substrate body 2*a* could be enhanced.

The wiring substrate 1*a* sealing the inside of the cavity 5*a* with the sealing resin is mounted on the surface, e.g., that of a mother board through the not-shown surface electrode positioned on the surface of the mother board and through the soldering material formed across the recessed conductors 15 and 21, their back electrode 17 and so on.

The wiring substrate 1*a* thus far described was manufactured: by laminating/pressing a plurality of green sheets, which were made mainly of alumina on the surface with a predetermined pattern of conductive paste containing metallic powder of W or Mo; by sintering the laminate obtained by printing the side face 7*a* of the cavity 5*a* formed with the conductive paste, at a temperature within a desired range; and by plating the laminate with Ni, Au or Ag by contacting plating electrodes with the recessed conductors 15 and 21.

Alternatively, the wiring substrate 1*a* could also be manufactured by the following multiple method.

Figure 10:
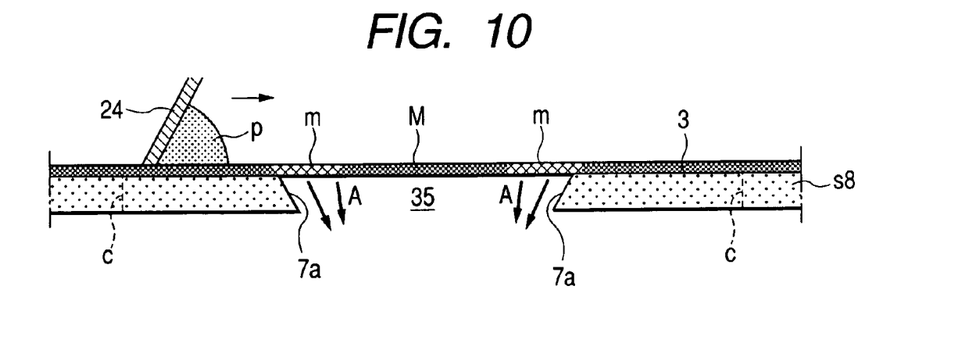
FIG. 10 is a schematic diagram showing one manufacturing process for obtaining the wiring substrate.

First of all, as shown in FIG. 10, there was prepared the large-sized green sheet s8 having the upper end portions of that of product portions, longitudinally and transversely, which would become the upper end portion of the substrate body 2*a* having a through hole 35 to become a portion of the cavity 5*a*.

At the individual intersections of cutting lines c, as indicated by broken lines in FIG. 10, column-shaped through holes 26 were later formed by a press-cutting operation.

Here, the green sheets s8 to s10 to form the cavity 5*a* were punched out at a predetermined clearance between the punch and the through holes of the die thereby to form the through holes 35 to become the cavity 5*a* having the sloped side face.

As shown in FIG. 10, a metal mask M was mounted on the side of the first surface 3 of the large-sized green sheet s8, and net portions m having a ring shape in a top plan view on the metal mask M and a desired width size were arranged just above the side face 7*a* of the through hole 35 of each product portion. As indicated by a vertical arrow in FIG. 5, air A was sucked downward in the vicinity of the ring-shaped net portions m. Of the metal mask M, the portions other than the net portions m were clogged by applying an emulsion.

In this state, a conductive paste p was slid, as indicated by a horizontal solid arrow in FIG. 10, along the upper face of the metal mask M while being pressed by squeegee 24 in an oblique position. As a result, the conductive paste p passed the ring-shaped net portions m so that a metallized layer 19*e* was printed along the side face 7*a* of a through hole 36 of a conical shape and so that a metallized layer 19*c* continuing to the upper end of the metallized layer 19*c* was printed along the first surface 3 of the green sheet s8, as shown in the upper portion of FIG. 11.

Moreover, the green sheet s8 was inverted upside down, and the conductive paste P was likewise printed to form a metallized layer 19*d* on the bottom face of the green sheet s8. These steps were applied to the green sheets s9 and s10 so that metallized layers 19*a* and 19*c* to 19*d* were formed substantially in a C-shape. After this, the green sheets s8 to s10 were laminated to form a large-sized laminate S4, as shown in the upper portion of FIG. 11. At this time, the metallized layers 19*a* and 19*a* to 19*d* having the C-shaped section for the individual green sheets s8 to s10 were formed into the metallized layers 19 having a substantially comb-shaped section in their entirety.

Figure 11:
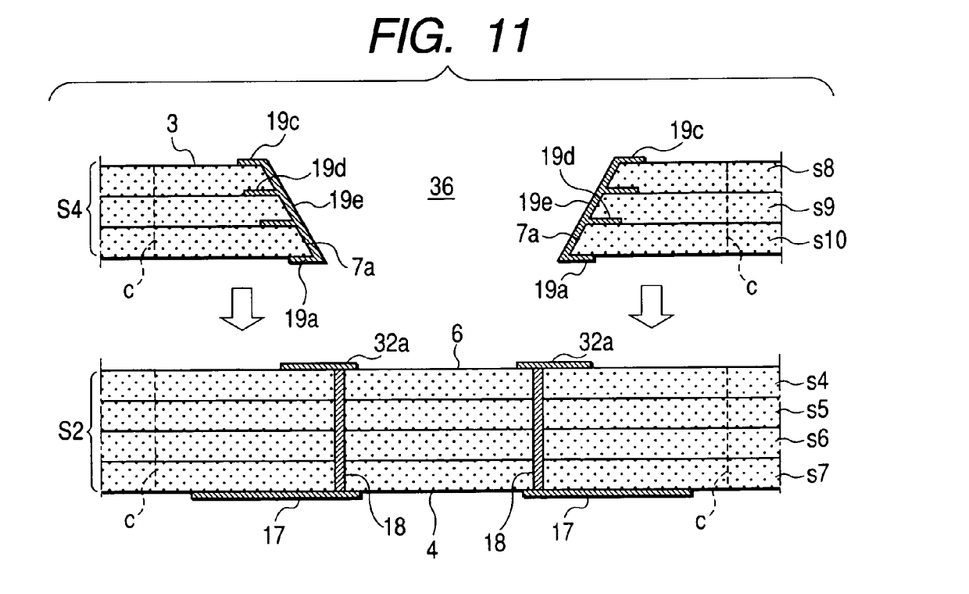
FIG. 11 is a schematic diagram showing a manufacturing step subsequent to FIG. 10.

Next, as shown in the lower portion of FIG. 11, the plural green sheets s4 to s7 to form the substantially lower halves of the individual product portions were laminated to form a large-sized laminate S2, and the conductive paste p of a ring shape was printed on the surface of the laminate S2 by means of the metal mask M and the squeegee 24 thereby to form the metallized layer 32*a* of a ring shape. Here, the via conductors 18 had been formed in the respective product portions of the laminate S2 before the metallized layers were formed. The back electrode 17 was formed like before on the back surfaces 4 of the individual product portions.

Next, the laminate S4 was laminated and pressed on the laminate S2, as indicated by blank arrows in FIG. 11. Even if the laminates S2 and S4 have a displacement in their lamination, both their metallized layers 19*a* and 32*a* are electrically connected without fail, and the ceramic layers s4 and s10 were not exposed to the surface.

Figure 12:
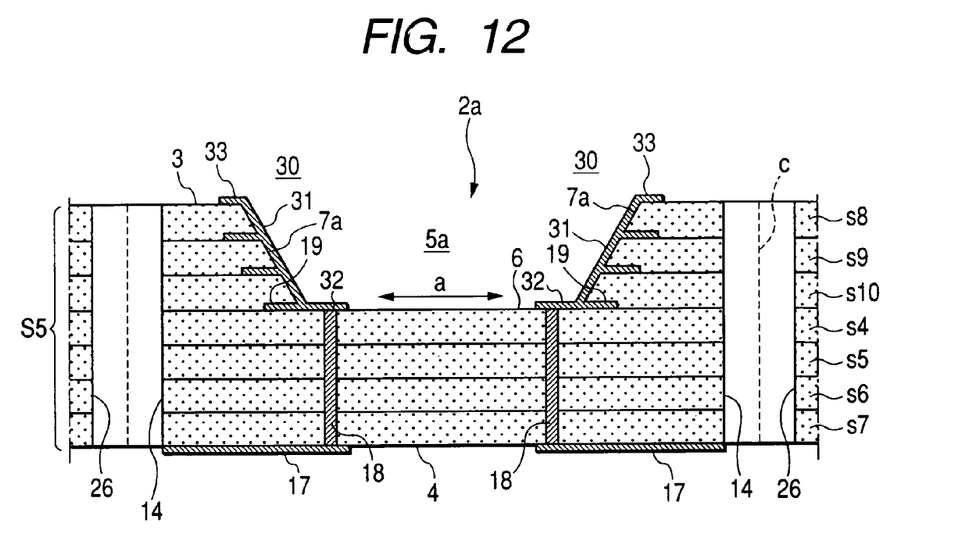
FIG. 12 is a schematic diagram showing a manufacturing step subsequent to FIG. 11.

As a result, there was obtained a large-sized laminate S5, in which the green sheets s4 to s10 were laminated and in which the individual product portions had the cavity 5*a* opened to the first surface 3, as shown in FIG. 12. At the lower corners of the cavity 5*a* of the individual product portions, moreover, the metallized layer 19*a* and the metallized layer 32*a* were connected to form the metallized layers 19 (19*u* to 19*z*) having a substantially comb-shaped section in their entirety, as shown in FIG. 12.

Moreover, the through holes 26 were formed at the intersections of the cutting lines c, and the (not-shown) metallized layers to become the recessed conductors 15 and 21 were printed on the inner circumference 26 of the through hole 26 and on the first surface 3 and the back surface 4 of the laminate S5 adjacent to the upper and lower ends of the through hole 26.

That laminate S5 was sintered at a temperature within a desired range and was then cut along the cutting lines c, to form the plural substrate bodies 2*a* having the recesses 4 and the recessed conductors 15 on the right and left opposed side faces and having the recesses 20 and the recessed conductors 21 at the four corners, as shown in FIG. 9.

Then, the plating electrodes were brought into contact with the recessed conductors 15 to plate the surface of the metallized layer 19 with the nickel-plated layer through the back electrode 17 and the via conductors 18, and the nickel-plated layer was plated on its surface with the Ag-plated layer thereby to form the light reflecting layer 30. Thus, the substrate body 2*a* was manufactured, as shown in FIGS. 8 and 9.

Alternatively, the green sheets s8 to s10 may be laminated beforehand to form the large-sized laminate S4, and the conductive paste p may be printed, as shown in FIG. 10, on the side face 7*a*, the first surface 3 and the bottom face of that laminate S4 thereby to form the metallized layers 19*a* to 19*c* having a substantially C-shaped section.

Figure 13:
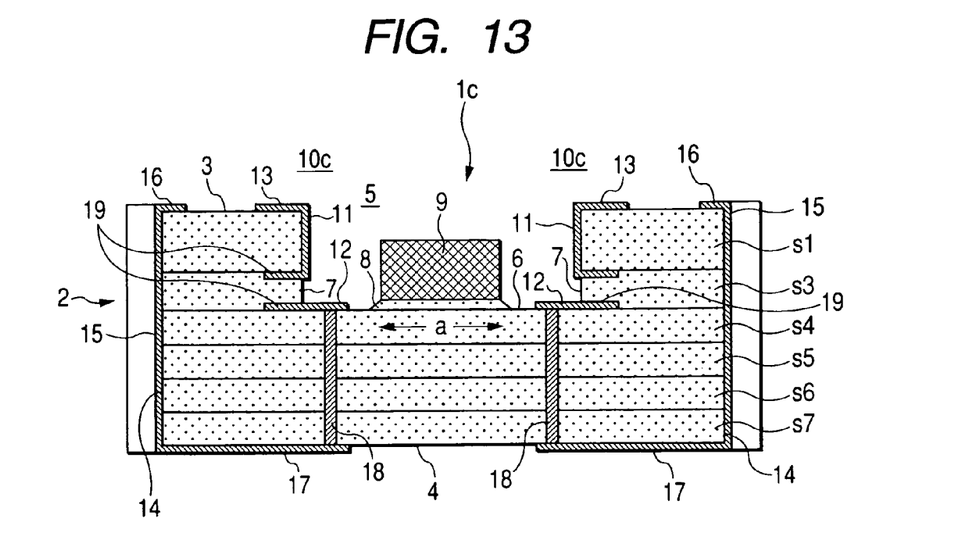
FIG. 13 is a section showing a modification of the wiring substrate for mounting light emitting element of FIGS. 1 and 2.

FIG. 13 is a vertical section showing a wiring substrate 1*c* according to a modification of the wiring substrate 1. The wiring substrate 1*c* is basically identical to the wiring substrate 1 but is different only in a light reflecting layer 10*c*. In this light reflecting layer 10*c*, as shown in FIG. 13, the side face portion 11 formed on the side face 7 of the cavity 5 and the bottom face portion 12 formed on the bottom face 6 of the cavity 5 were separated at the ceramic layer s3.

In order to obtain the light reflecting layer 10*c*, as shown in FIGS. 6 and 7, the metallized layers 19*b* to 19*d* having a substantially C-shaped section were formed on the through hole 25 (or the side face 7) and the first surface and back surface of the green sheet s1 to become the ceramic layer s1, and this green sheet s1 and the green sheet s3 having nothing formed were laminated to form the laminate S1. This laminate S1 and the laminate S2 having the metallized layer 12*a* formed like before were laminated and were then sintered to obtain the wiring substrate 1*c* having the light reflecting layer 10*c* containing the metallized layers 19 (19*v* to 19*z*).

When the metallized layers 19*y* and 19*z* of the metallized layers 19, which were formed on the side face 7 of the cavity 5 and on the first surface 3 of the substrate body 2, are to be coated with the nickel-plated layer n or the Ag-plated layer f, there are prepared the plate electrodes which come into unique contact with those metallized layers.

Figure 14:
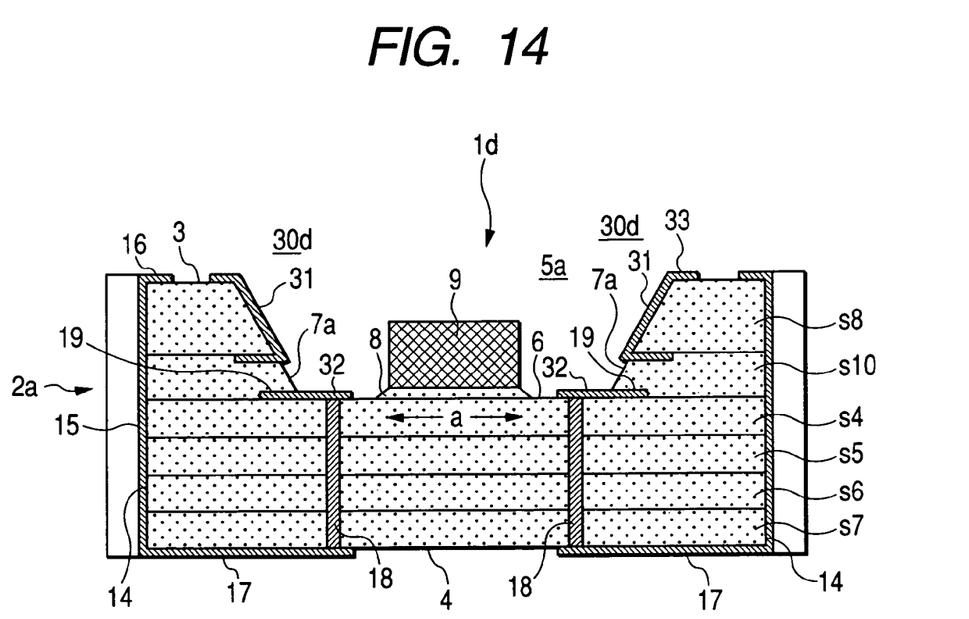
FIG. 14 is a section showing a modification of the wiring substrate for mounting light emitting element of FIGS. 8 and 9.

FIG. 14 is a vertical section showing a wiring substrate 1*d* according to a modification of the wiring substrate 1*a*. The wiring substrate 1*d* is basically identical to the wiring substrate 1*a* but is different only in a light reflecting layer 10*d*. In this light reflecting layer 30*d*, as shown in FIG. 14, the side face portion 31 formed on the side face 7*a* of the cavity 5*a* and the bottom face portion 32 formed on the bottom face 6 of the cavity 5*a* were separated at the ceramic layer s10.

In order to obtain the light reflecting layer 30*d*, as shown in FIGS. 11 and 12, the metallized layers 19*c* to 19*e* having a substantially C-shaped section were formed on the through hole 36 (or the side face 7*a*) and the first surface and back surface of the green sheet s8 to become the ceramic layer s8, and this green sheet s8 and the green sheet s10 having nothing formed were laminated to form the laminate S4. This laminate S4 and the laminate S2 having the metallized layer 32*a* formed like before were laminated and were then sintered like before to obtain the wiring substrate 1*d* having the light reflecting layer 30*d* containing the metallized layers 19 (19*v* to 19*z*). When the metallized layers 19*y* and 19*z* of the metallized layers 19, which were formed on the side face 7*a* of the cavity 5*a* and on the first surface 3 of the substrate body 2*a*, are to be coated with the nickel-plated layer n or the Ag-plated layer f, there are prepared the plate electrodes which come into unique contact with those metallized layers.

The present invention should not be limited to the individual modes thus far described.

The ceramics or an insulating material to form the substrate bodies 2 and 2*a* may also be composed mainly of mullite or aluminum nitride or the like.

Moreover, the insulating members to form the substrate bodies 2 and 2*a* may also be exemplified by an epoxy resin. A plurality of resin insulating layers of an epoxy resin, for example, may be sequentially laminated on the surface of a thin sheet of that resin or a metal, and a cavity may be formed in in each of the individual resin insulating layers at the relatively upper locations by the well-known photolithography. The continuous metal layer may be formed continuously on the side face and the bottom face of the cavity by a plating operation.

Moreover, the cavity should not be limited to the aforementioned circular shape but may also be a square or rectangular shape, the four corners of which may be filled with a conductive paste into an oval or elliptical shape in a top plan view. Side face portions of a metal layer may be formed on the side face of that oval or elliptical shape.

In addition, the wiring substrate of the present invention can also be modified such that the cavity to be opened in the first surface of one wiring substrate is formed in plurality, and such that a plurality of mounting areas are arranged on the bottom face of a single cavity thereby to mount the light emitting elements individually.

This application is based on Japanese Patent application JP 2004-353574, filed Dec. 7, 2004, the entire content of which is hereby incorporated by reference, the same as if set forth at length.

What is claimed is:

1. A wiring substrate for mounting a light emitting element, comprising:
a substrate body comprising a plurality of insulating layers and having a first surface and a back surface;
a cavity being opened into the first surface of said substrate body and having a mounting area for mounting a light emitting element at a bottom face of said cavity, said plurality of insulating layers being present between the first surface of the substrate body and the bottom of the cavity;
at least one metallized layer surrounding said cavity, provided between adjacent ones of said plurality of insulating layers, and protruding into the substrate body between the first surface of the substrate body and the bottom of the cavity; and
a metallized layer having first and second ends provided on a side face of said cavity and continuing to said at least one metallized layer protruding into the substrate body;
wherein the at least one metallized layer protruding into the substrate body being connected to the end portion of the metallized layer provided on the side face of said cavity closest to the bottom of the cavity;

wherein the metallized layer provided on the side face of said cavity continuously surrounds said cavity; and wherein the metallized layer provided on the side face of said cavity is separated from a metallized layer disposed on the bottom face of said cavity.

2. The wiring substrate according to claim 1, wherein said metallized layer provided on a side face of said cavity continues from an upper end of said side face of said cavity to said first surface of said substrate body.

3. The wiring substrate according to claim 2, wherein of said metallized layers, the metallized layers provided continuously on a side face of said cavity and on said first surface of said substrate body comprise at least one of W and Mo and are coated with plated layers.

4. The wiring substrate according to claim 3, wherein said plated layers comprise a nickel-plated layer and an Ag-plated layer.

5. The wiring substrate according to claim 1, wherein a horizontal portion of the metallized layer disposed on the bottom face of said cavity proceeds at its outer end portion into said substrate body.

6. The wiring substrate according to claim 1, wherein of said metallized layers, the metallized layer provided on a side face of said cavity comprises at least one of W and Mo and is coated with plated layers.

7. The wiring substrate according to claim 6, wherein said plated layers comprise a nickel-plated layer and an Ag-plated layer.

8. The wiring substrate according to claim 1, wherein an insulating layer separates the metallized layer provided on the side face of the cavity from the metallized layer disposed on the bottom face of the cavity.

* * * * *